(12) United States Patent
Kim

(10) Patent No.: US 7,586,345 B2
(45) Date of Patent: Sep. 8, 2009

(54) OVER-VOLTAGE PROTECTION CIRCUIT AND METHOD THEREOF

(75) Inventor: Dae-yong Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 11/790,361

(22) Filed: Apr. 25, 2007

(65) Prior Publication Data

US 2007/0285861 A1    Dec. 13, 2007

(30) Foreign Application Priority Data

May 10, 2006   (KR) .................. 10-2006-0041968

(51) Int. Cl.
*H03L 7/00*   (2006.01)
(52) U.S. Cl. .................. 327/143; 327/77; 327/80; 361/91.1
(58) Field of Classification Search .......... 327/142, 327/143, 161, 198, 538–543, 379, 387, 392, 327/399, 545, 72, 77, 78, 80, 81; 326/82–83; 361/88–91.3, 91.5
See application file for complete search history.

(56) References Cited

U.S. PATENT DOCUMENTS 4,438,473 A * 3/1984 Cawley et al. .............. 361/18
4,787,007 A * 11/1988 Matsumura et al. ......... 361/98
6,657,480 B2 * 12/2003 Ochi ....................... 327/539
6,901,520 B2   5/2005 Odaohhara et al.

FOREIGN PATENT DOCUMENTS

| JP | 01-273887 | 11/1989 |
| JP | 2005-051919 | 2/2005 |
| KR | 10-2000-0055451 A | 9/2000 |
| KR | 10-2003-0029736 A | 4/2003 |

* cited by examiner

*Primary Examiner*—Long Nguyen
(74) *Attorney, Agent, or Firm*—Harness, Dickey & Pierce, P.L.C.

(57) ABSTRACT

Example embodiments are directed to an over-voltage protection circuit and method thereof. The over-voltage protection circuit may include a voltage converter, a voltage comparator, a delay unit, and/or a switching unit. The voltage converter may be configured to generate first voltage and second voltages from a supply voltage. The voltage comparator may be configured to compare the first voltage with the second voltage and to generate a control signal according to the comparison result. The switching unit may be configured to determine whether to apply the supply voltage to a chip in response to the control signal. The delay unit may be configured to delay transmission of the control signal to the switching unit by a delay time.

25 Claims, 5 Drawing Sheets

US 7,586,345 B2

OVER-VOLTAGE PROTECTION CIRCUIT AND METHOD THEREOF

PRIORITY STATEMENT

This application claims the benefit of Korean Patent Application No. 10-2006-0041968, filed on May 10, 2006, in the Korean Intellectual Property Office, the entire contents of which are incorporated herein by reference.

BACKGROUND

1. Field

Example embodiments relate to an over-voltage protection circuit and method thereof, for example, an over-voltage protection circuit and method detecting an over-voltage using a delay time.

2. Description of the Related Art

Over-voltage protection circuits may be used to prevent reliability deterioration of a digital logic circuit generated when a voltage greater than a predetermined or given voltage is applied to a digital logic circuit in a System On Chip (SOC). For example, in a 5V logic high system, when a voltage greater than about 6V is applied to a certain digital logic circuit, the reliability may deteriorate, and this voltage greater than 6V may be referred to as an "over-voltage".

FIG. 1 is a block diagram schematically illustrating an example system including a conventional over-voltage protection circuit 10.

Referring to FIG. 1, the over-voltage protection circuit 10 may determine whether a supply voltage USB is an over-voltage. The over-voltage protection circuit 10 may apply the supply voltage USB to a System On Chip (SOC) 20 when the supply voltage USB is not an over-voltage.

The over-voltage protection circuit 10 may be implemented as an independent chip separate from the SOC 20. However, if the over-voltage protection circuit 10 is implemented in this way, the unit cost of the chip and the layout size of the system may increase. Thus, the increase in chip unit cost may make the system's price less competitive and the increase in system layout size may require further minimization and integration.

Also, when the supply voltage USB changes rapidly, for example, within several nano-seconds, the over-voltage protection circuit 10 may not be able to correctly detect the voltage level of the supply voltage USB.

FIG. 2 is a graph illustrating an example change in voltage with respect to time when a failure to detect operation occurs in the conventional over-voltage protection circuit 10.

Referring to FIGS. 1 and 2, if no load current exists, when a supply voltage USB of 15V is applied to the over-voltage protection circuit 10, the supply voltage USB may temporarily slew within 100 ns. In this case, the over-voltage protection circuit 10 may not generate a normal output when the supply voltage USB changes rapidly.

That is, the over-voltage protection circuit 10 may not be able to cut off the supply voltage USB of 15V in a predetermined or given time after t1, which may result in losing the over-voltage protection control function with respect to the SOC 20. The temporary loss of the over-voltage protection control function may cause significant damage to the SOC 20.

SUMMARY

An over-voltage protection circuit according to example embodiments may include a voltage converter, a voltage comparator, a switching unit, and/or a delay unit. The voltage converter may be configured to generate first and second voltages from a supply voltage. The voltage comparator may be configured to compare the first voltage with the second voltage and to generate a control signal according to the comparison result. The switching unit may be configured to determine whether to apply the supply voltage to a chip in response to the control signal. The delay unit may be configured to delay transmission of the control signal to the switching unit by a delay time. The delay time may be long enough to detect a transition in the supply voltage.

The voltage converter may include first and second voltage generators. The first voltage generator may be configured to generate the first voltage from the supply voltage and the second voltage generator may be configured to generate the second voltage from the supply voltage. The first voltage may saturate at a given voltage level and the second voltage may be proportional to the supply voltage. The first voltage generator may include a plurality of bipolar junction transistor (BJT) diodes, the number of which may determine the voltage level at which the first voltage saturates. The second voltage generator may include a voltage divider with a plurality of resistors, and may generate the second voltage by dividing the supply voltage. The voltage converter may be disposed on the chip.

The delay unit may include a delay circuit configured to generate an enable signal delayed by the delay time for activating the control signal, and to transmit the delayed enable signal to the voltage comparator. The delay circuit may generate the enable signal when a reference voltage is greater than a given voltage level. The delay unit may include a voltage divider configured to divide the supply voltage at a given ratio and to generate the reference voltage. The voltage divider may include a plurality of resistors. The delay circuit may be an RC-DELAY Power On Reset (POR) circuit. The voltage comparator may determine whether to transmit the control signal to the switching unit in response to the enable signal.

The delay unit and/or the voltage comparator may be disposed on the chip.

The switching unit may apply the supply voltage to the chip when the first voltage is greater than the second voltage. The switching unit may include an NMOS transistor, a resistor, and a PMOS transistor. The NMOS transistor's gate voltage may be controlled by the control signal. The resistor may reduce the supply voltage by a given amount. The PMOS transistor's gate voltage may be controlled by the supply voltage reduced by the given amount, and turned on when the first voltage is greater than the second voltage.

The chip may be a System On Chip (SOC).

An over-voltage protection method according to example embodiments may include generating a first voltage and a second voltage from a supply voltage, comparing the first voltage with the second voltage, and/or determining whether to apply the supply voltage to a chip according to the comparison result.

The comparison result may be delayed by a delay time. The delay time may be long enough to detect a transition in the supply voltage. The delay time may be generated by a delay circuit enabled when a reference voltage is greater than a given voltage. The delay circuit may be disposed on the chip and may be an RC-DELAY Power On Reset (POR) circuit.

The reference voltage may be obtained by dividing the supply voltage at a given ratio using a plurality of resistors. The supply voltage may be applied to the chip when the first voltage is greater than the second voltage.

The first voltage may saturate at a given voltage level and may vary according to a plurality of bipolar junction transistor (BJT) diodes disposed on the chip, the number of which may determine the given voltage level at which the first voltage saturates. The second voltage may be proportional to the supply voltage and may vary depending on a resistor ladder disposed on the chip and including at least two resistors connected to each other in series.

The chip may be a System On Chip (SOC).

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
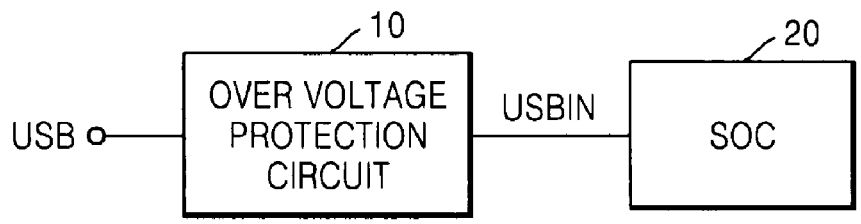
FIG. 1 is a block diagram schematically illustrating an example system including a conventional over-voltage protection circuit.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
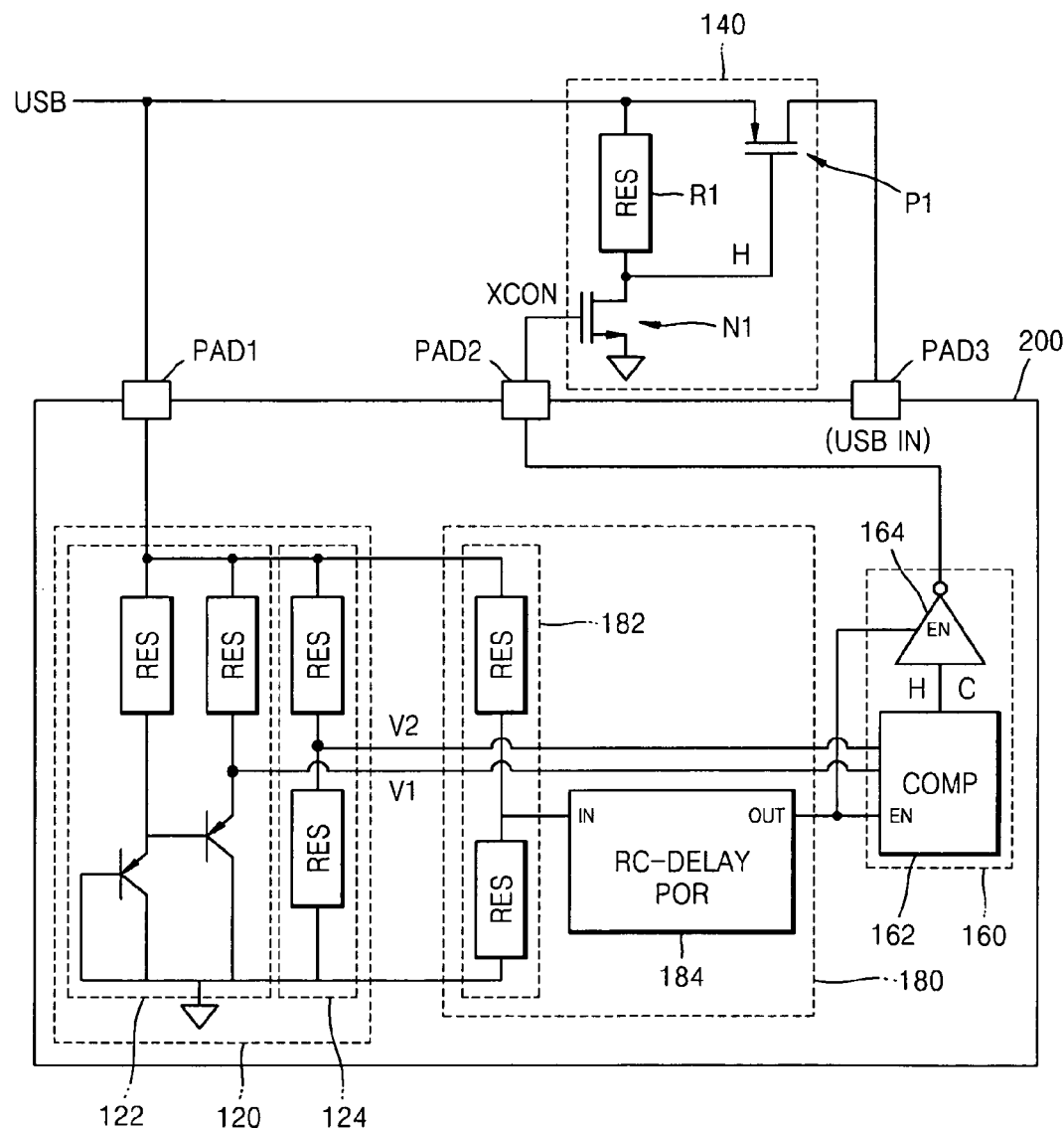
FIG. 3 is a view schematically illustrating an example over-voltage protection circuit according example embodiments.
Figure 4:
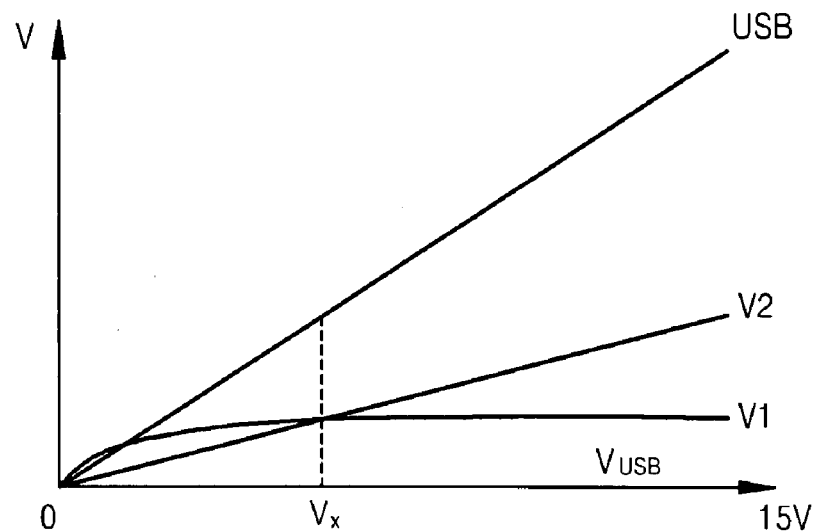
FIG. 4 is a graph illustrating an example plot of first and second voltages of the over-voltage protection circuit illustrated in FIG. 3.

FIG. 3 is a view schematically illustrating an over-voltage protection circuit according to example embodiments. FIG. 4 is a graph illustrating a plot of a first voltage V1 and a second voltage V2 of the over-voltage protection circuit illustrated in FIG. 3. Referring to FIGS. 3 and 4, the over-voltage protection circuit may include a voltage converter 120, a voltage comparator 160, a switching unit 140, and/or a delay unit 180.

The voltage converter 120 may convert a supply voltage USB into a first voltage V1 and a second voltage V2. The supply voltage USB is provided from an area external to the chip 200 through a first pad PAD1 of the chip 200. The first voltage V1 may saturate at a predetermined or given voltage level, and the second voltage V2 may be proportional to the supply voltage USB. The voltage converter 120 may be included in a chip 200. The chip 200 may be a System On Chip (SOC).

The voltage converter 120 may include a first voltage generator 122 and a second voltage generator 124.

The first voltage generator 122 may generate the first voltage V1 from the supply voltage USB. The first voltage generator 122 may include a plurality of bipolar junction transistor (BJT) diodes, the number and characteristics of which may determine a voltage level at which the first voltage V1 may saturate. In FIG. 3, the first voltage generator 122 may, for example, include two resistors and two BJT diodes.

The second voltage generator 124 may generate the second voltage V2 from the supply voltage USB. The second voltage generator 124 may include a plurality of resistors. In FIG. 3, the second voltage generator 124 may include a resistor ladder in which two resistors may be connected in series to each other. The second voltage generator 124 may divide the supply voltage USB, thereby generating the second voltage V2.

In more detail, the supply voltage USB of a maximum of 15V, for example, may be applied to the chip 200 via a pad. The first voltage generator 122 and the second voltage generator 124, which may be disposed on the chip 200, may receive the supply voltage USB.

The supply voltage USB, as illustrated in FIG. 4, may increase from 0V to 15V, for example, and may be applied to the first voltage generator 122 and the second voltage generator 124. The first voltage generator 122 may convert the supply voltage USB to the saturated first voltage V1 when the supply voltage USB exceeds a predetermined or given voltage Vx, according to the characteristics of the BJT diodes.

The value of the saturated first voltage Vi may be adjusted according to the number of stacks of diodes, as described above. Since the first voltage generator 122 illustrated in FIG. 3 may include two stacks of diodes, for example, the saturated first voltage V1 may be about 1.4V.

The second voltage generator 124 may generate the second voltage V2, whose slope may depend on a ratio including the serial resistors of the resistor ladder. Referring to FIG. 4, when the supply voltage V2 is equal to the predetermined or given voltage Vx, the first voltage V1 may be equal to the second voltage V2. That is, when the supply voltage USB is less than the predetermined or given voltage Vx, the second voltage V2 may be less than the first voltage V1, and when the supply voltage USB is greater than the predetermined or given voltage Vx, the second voltage V2 may be greater than the first voltage V1.

As described above, because the first voltage V1 and the second voltage V2 may respectively depend on the number of diode stacks and the ratio including the serial resistors of the resistor ladder, the value of the predetermined or given voltage Vx may be set by adjusting the number of diode stacks or the ratio including the serial resistors of the resistor ladder. For example, in a 5V logic high system, since the predetermined voltage Vx may indicate whether the supply voltage USB is an over-voltage, the predetermined or given voltage Vx may be set to about 6V.

Referring to FIG. 3, the voltage comparator 160 may compare the first voltage V1 with the second voltage V2, and may generate a control signal XCON. The voltage comparator 160 may be disposed on the chip 200 like the voltage converter 120.

The voltage comparator 160 may include a comparator 162 and an inverter 164. The comparator 162 may receive the first voltage V1 and the second voltage V2, compare them to each other, and output the comparison result.

In other words, when the second voltage V2 is greater than the first voltage V1, that is, when the supply voltage USB is greater than the predetermined or given voltage Vx, the comparator 162 may output the comparison result as a logic high level. Furthermore, when the second voltage V2 is less than the first voltage V1, that is, when the supply voltage USB is less than the predetermined or given voltage Vx, the comparator 162 may output the comparison result as a logic low level.

The inverter 164 may invert the logic level of the comparison result and generate the inverted result as the control signal XCON. Accordingly, if the supply voltage USB is an over-voltage, that is, if the supply voltage USB is greater than the predetermined or given voltage Vx, the inverter 164 may generate the control signal XCON as a logic low ("L") level.

The voltage comparator 160 may use the second voltage V2 as a supply voltage. The second voltage V2 may be used as a supply voltage of the voltage comparator 160 because the voltage comparator 162 may only have to output high or low logic levels. That is, since the comparator 162 may not need to perform high speed operations, a deterioration in characteristics according to a change in supply voltage may be tolerated.

If the second voltage V2 is used as an operating voltage by the voltage comparator 160, another supply voltage for operating the voltage comparator 160 may not be required, and issues involving a resisting pressure may be avoided.

Referring to FIG. 3, the switching unit 140 may determine whether to apply the supply voltage USB to the chip 200 through a third pad PAD3 of the chip 200 in response to the control signal XCON provided by the voltage comparator 160 through a second pad PAD2 of the chip 200. The switching unit 140 may be disposed outside of the chip 200, in contrast to the voltage converter 120 and the voltage comparator 160. Because the switching unit 140 may include components according to a specific field effect transistor (FET) process, the switching unit 140 may not be as easily integrated.

If the first voltage V1 is greater than the second voltage V2, the switching unit 140 may apply the supply voltage USB to the chip 200. The switching unit 140 may include an NMOS transistor N1, a resistor R1, and a PMOS transistor P1. The gate voltage of the NMOS transistor N1 may accept the control signal XCON as an input. Accordingly, if the supply voltage USB is not an over-voltage, that is, if the first voltage V1 is greater than the second voltage V2 so that the control signal XCON with a logic high level is applied to the switching unit 140, the NMOS transistor N1 may be turned on.

If the NMOS transistor N1 is turned on, a current may flow through the resistor R1 to drop the supply voltage USB by a predetermined or given voltage. The resistor R1 may have resistance between 10KΩ and 100KΩ, for example.

The gate voltage of the PMOS transistor P1 may be a supply voltage reduced by a predetermined or given voltage by the resistor R1. Accordingly, the PMOS transistor P1 may be turned on. That is, if the first voltage V1 is greater than the second voltage V2, the supply voltage USB may be applied to the digital logic circuit of the chip 200.

If the supply voltage USB is an over-voltage, that is, if the first voltage V1 is less than the second voltage V2, so that the control signal XCON with a logic low "L" level is applied to the switching unit 140, the NMOS transistor N1 may be turned off. If the NMOS transistor N1 is turned off, no current may flow through the resistor R1. Accordingly, the PMOS transistor P1 may be turned off. That is, if the first voltage V1 is less than the second voltage V2 (if the supply voltage USB is an over-voltage), the supply voltage USB may not be applied to the digital logic circuit of the chip 200.

Figure 5:
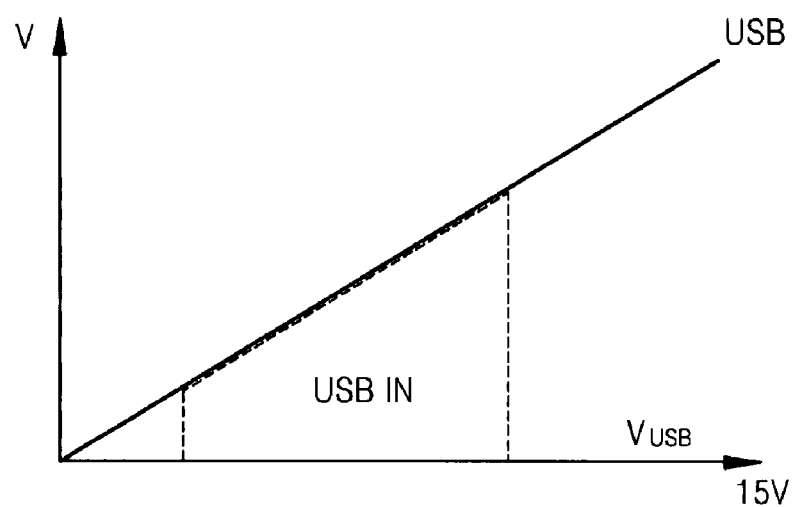
FIG. 5 is graph illustrating an example voltage range that may be applied to a chip through the over-voltage protection circuit illustrated in FIG. 3.

FIG. 5 is graph illustrating an example voltage range that may be applied to the chip 200 through the over-voltage protection circuit illustrated in FIG. 3.

Referring to FIGS. 3 and 5, the over-voltage protection circuit illustrated in FIG. 3 may apply a voltage within a given voltage range to the chip 200 and not influence the reliability of the device. That is, the over-voltage protection circuit according to example embodiments may reduce the supply voltage USB by allowing the number of BJT diode stacks in the first voltage generator 122 or the ratio including the resistor ladder in the second voltage generator 124 to be adjusted when a higher voltage is applied to the chip 200.

Figure 2:
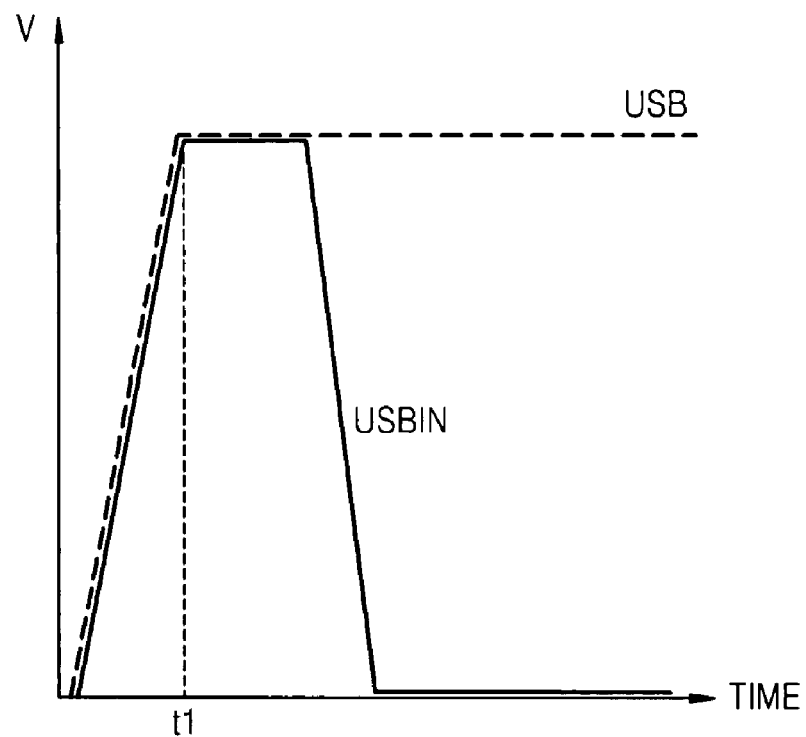
FIG. 2 is a graph illustrating an example change in voltage with respect to time when a failure to detect operation occurs in the conventional over-voltage protection circuit of FIG. 1.

If the supply voltage USB varies rapidly, (for example, if the supply voltage USB were to change by about 15V within about 100 ns in the example described previously) the first voltage V1 and the second voltage V2 may also change rapidly, and the voltage comparator 160 may not be able to output a control signal XCON in correspondence with the rapid variation in the first voltage V1 and the second voltage V2. In this example case, as illustrated in FIG. 2, an over-voltage of 15V may be applied to the chip 200 during a predetermined or given time after t1, which may cause a failure to detect operation of the chip 200.

However, In order to prevent an over-voltage from being applied due to the rapid variation in voltage of the supply voltage USB, the over-voltage protection circuit according to example embodiments may include a delay unit 180 disposed inside the chip 200.

The delay unit 180 may include a delay circuit 184. The delay circuit 184 may transmit an enable signal EN, delayed by a predetermined or given delay time, to the voltage comparator 160. The enable signal may be used to activate the control signal XCON. The delay circuit 184 may be an RC-DELAY power on reset (POR) circuit.

Figure 6:
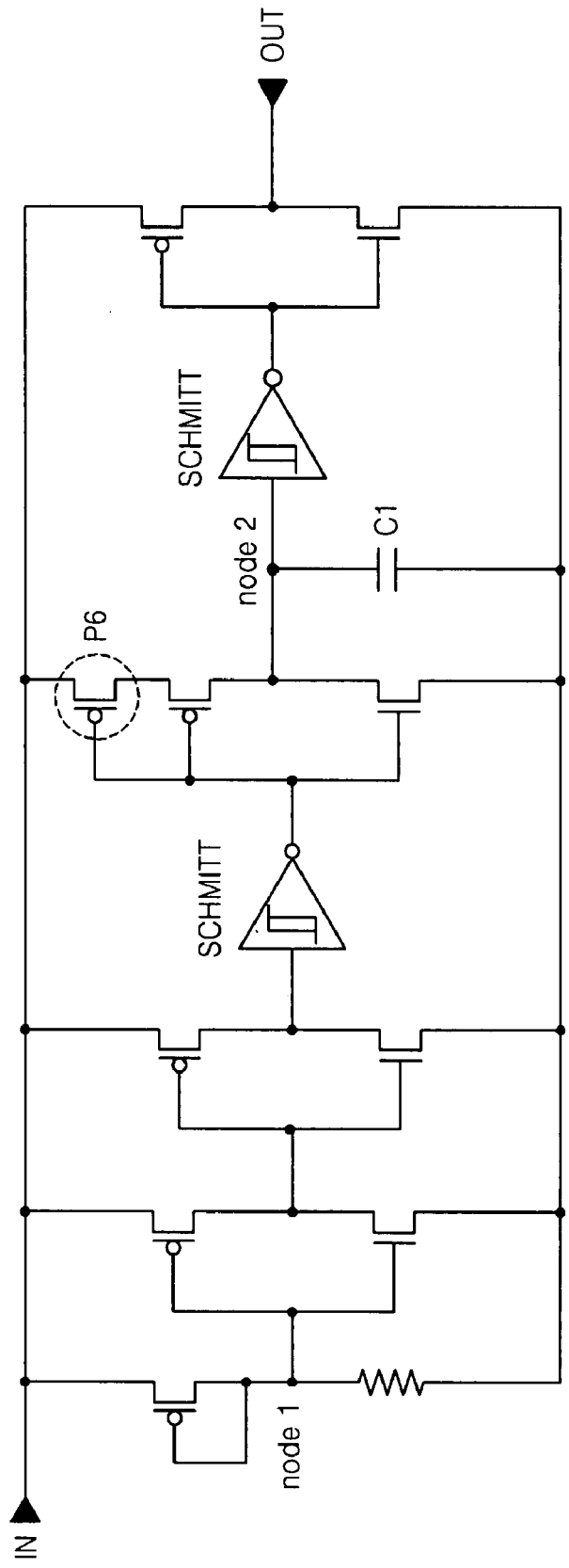
FIG. 6 is a circuit diagram illustrating an example delay circuit of the over-voltage protection circuit illustrated in FIG. 3.

FIG. 6 is a circuit diagram of the delay circuit 184 of the over-voltage protection circuit illustrated in FIG. 3.

Referring to FIGS. 3 and 6, the delay circuit 184 may be activated when the input voltage IN is greater than a predetermined or given voltage level. The input voltage IN may be a reference voltage, for example. The delay unit 180 may also include a voltage divider 182 in order to generate a reference voltage IN and apply it to the delay circuit 184. The voltage divider 182 may include a plurality of resistors and may divide the supply voltage USB at a certain ratio, thereby generating the reference voltage IN. Accordingly, the reference voltage IN may also vary when the supply voltage USB varies.

For example, if reference voltage IN is about 4.2V, even when a supply voltage USB of a maximum of 15V is applied, the reference voltage IN may be generated by dividing the supply voltage USB at a ratio of about 1:4.5. Thus, a general CMOS LOGIC process may be more easily applied.

Also, as described above, if the reference voltage IN is set to have a value of about 1:4.5 of the supply voltage USB, the delay circuit 184 may operate even when the supply voltage USB is at about 3.5 V. That is, since a voltage greater than a threshold voltage is applied to the delay circuit 184 even when the supply voltage USB of about 3.5V is supplied, the delay circuit 184 may be activated.

Referring to FIGS. 3 and 6, if a reference voltage IN greater than the threshold voltage is applied, the delay circuit 184 may generate the enable signal EN. As described above, the enable signal EN may be delayed by the delay time. The enable signal EN may also have the same voltage level as the reference voltage IN.

The delay time may vary according to the sizes of a PMOS transistor P6 and a capacitor C1. That is, the delay time may be set according to the amount of current though the PMOS transistor P6, a charge time by the capacitor C1, etc . . .

The delay time should be long enough to allow the over-voltage protection circuit to stably detect a change in the supply voltage USB. For example, the delay time may be about 50 μs. More detailed operations of the delay circuit 184 may be well known to those skilled in the art, and thus, a detailed description thereof will be omitted.

If the enable signal EN is delayed by the delay time and transmitted as a logic high level to the voltage comparator 160, the voltage comparator 160 may output the control signal XCON to the switching unit 140. That is, when the enable signal EN is activated, the voltage comparator 160 may transmit the control signal XCON to the switching unit 140.

Accordingly, the over-voltage protection circuit may perform a stable over-voltage protection control operation when the supply voltage USB varies rapidly by maintaining the internal state of the circuit during the delay time.

Figure 7:
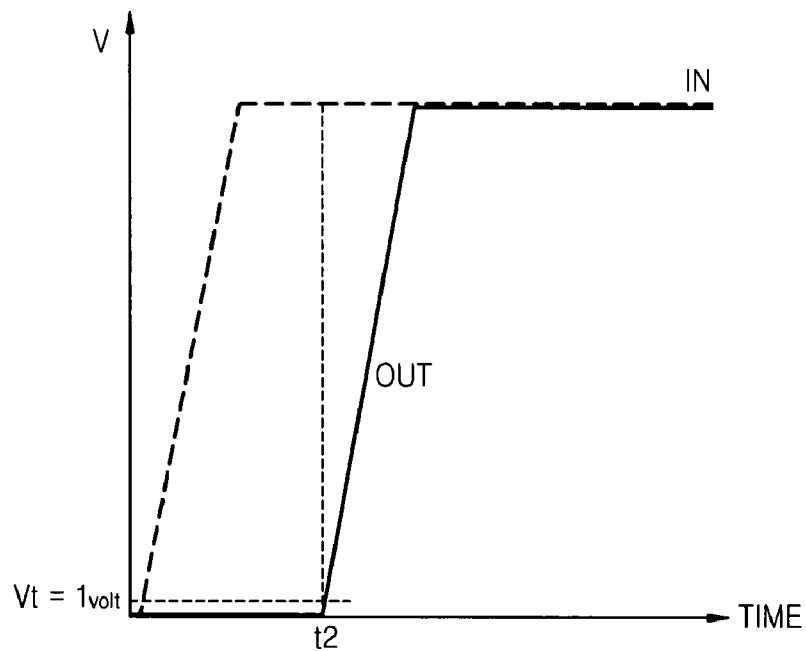
FIG. 7 is a graph plotted to illustrate example operating characteristics of the delay circuit of the over-voltage protection circuit illustrated in FIG. 6.

FIG. 7 is a graph plotted to illustrate example operating characteristics of the delay circuit 184 illustrated in FIG. 6.

Referring to FIGS. 3 and 7, the delay circuit 184 may output the enable signal EN after a delay time t2 elapses. Accordingly, the over-voltage protection circuit according to example embodiments may alleviate problems caused when no over-voltage is detected during the predetermined or given time after t1, as illustrated in FIG. 2.

Figure 8:
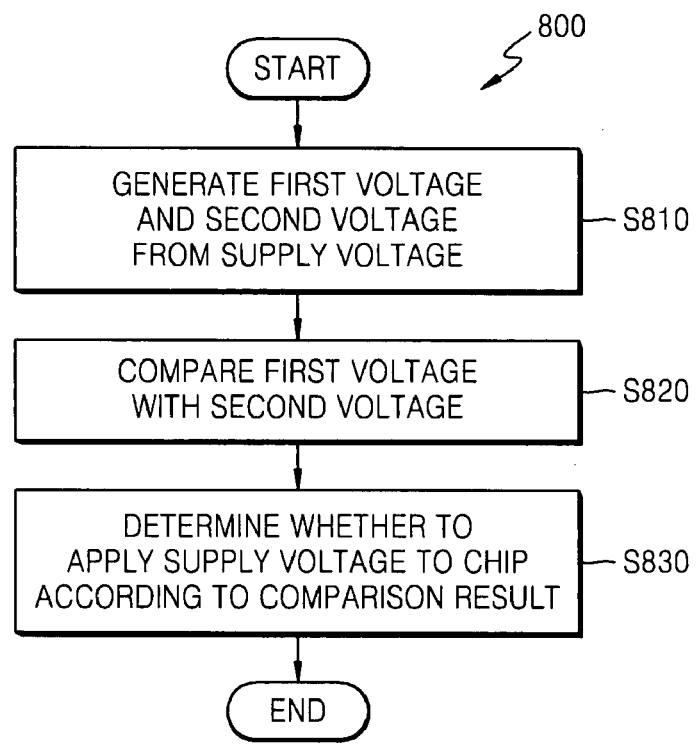
FIG. 8 is a flowchart illustrating an example over-voltage protection method according to example embodiments.

FIG. 8 is a flowchart illustrating an over-voltage protection method 800 according to example embodiments.

Referring to FIG. 8, the over-voltage protection method 800 may include converting a supply voltage into a first voltage and a second voltage (operation S810), comparing the first voltage with the second voltage (operation S820), and/or determining whether to apply the supply voltage to a chip according to the first voltage and the second voltage (operation S830).

The comparison result may be delayed by a delay time. The delay time may be long enough to detect a transition in the supply voltage.

The over-voltage protection method may have the same technical characteristics as the over-voltage protection circuit described above. Therefore, the over-voltage protection method may be easily understood by those skilled in the art with reference to the above description, and a more detailed description thereof will be omitted.

As described above, in the over-voltage protection circuit and method according to example embodiments, it may be possible to reduce chip cost and chip layout size by disposing logic analysis to determine whether an over-voltage is being applied to a chip. Also, since the over-voltage protection circuit according example embodiments may include a delay circuit, it may be possible to stably perform an over-voltage protection operation when a supply voltage varies rapidly.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An over-voltage protection circuit, comprising:
    a voltage converter that is located inside a chip and generates first and second voltages from a supply voltage provided from outside of the chip through a first pad of the chip;
    a voltage comparator that is located inside of the chip and compares the first voltage with the second voltage and to generate a control signal according to the comparison result;
    a switching unit that is located outside of the chip and determines whether to apply the supply voltage to the chip through a second pad of the chip in response to the control signal provided by the voltage comparator through a third pad of the chip; and
    a delay unit that is located inside of the chip and delays transmission of the control signal to the switching unit by a delay time.

2. The over-voltage protection circuit of claim 1, wherein the delay time is long enough to detect a transition in the supply voltage.

3. The over-voltage protection circuit of claim 1, wherein the voltage converter comprises:
    a first voltage generator configured to generate the first voltage from the supply voltage; and
    a second voltage generator configured to generate the second voltage from the supply voltage,
    wherein the first voltage saturates at a given voltage level and the second voltage is proportional to the supply voltage.

4. The over-voltage protection circuit of claim 3, wherein the first voltage generator includes a plurality of bipolar junction transistor (BJT) diodes, the number of which determines the voltage level at which the first voltage saturates.

5. The over-voltage protection circuit of claim 3, wherein the second voltage generator includes a voltage divider with a plurality of resistors, and generates the second voltage by dividing the supply voltage.

6. The over-voltage protection circuit of claim 1, wherein the delay unit includes a delay circuit configured to generate an enable signal delayed by the delay time for activating the control signal, and to transmit the delayed enable signal to the voltage comparator.

7. The over-voltage protection circuit of claim 6, wherein the delay circuit generates the enable signal when a reference voltage is greater than a given voltage level.

8. The over-voltage protection circuit of claim 7, wherein the delay unit includes a voltage divider configured to divide the supply voltage at a given ratio and to generate the reference voltage.

9. The over-voltage protection circuit of claim 8, wherein the voltage divider includes a plurality of resistors.

10. The over-voltage protection circuit of claim 6, wherein the delay circuit is an RC-DELAY Power On Reset (POR) circuit.

11. The over-voltage protection circuit of claim 6, wherein the voltage comparator determines whether to transmit the control signal to the switching unit in response to the enable signal.

12. The over-voltage protection circuit of claim 1, wherein the switching unit applies the supply voltage to the chip when the first voltage is greater than the second voltage.

13. The over-voltage protection circuit of claim 12, wherein the switching unit comprises:
    an NMOS transistor whose gate voltage is controlled by the control signal;
    a resistor reducing the supply voltage by a given amount; and
    a PMOS transistor whose gate voltage is controlled by the supply voltage reduced by the given amount, and turned on when the first voltage is greater than the second voltage.

14. The over-voltage protection circuit of claim 1, wherein the chip is a System On Chip (SOC).

15. An over-voltage protection method, comprising:
    generating a first voltage and a second voltage from a supply voltage provided from outside of a chip through a first pad of the chip, where the first and second voltages are generated using a voltage converter that is located inside of the chip;
    comparing the first voltage with the second voltage using a voltage comparator that is located inside of the chip; and
    determining whether to apply the supply voltage to the chip through a second pad of the chip according to the comparison result provided by the voltage comparator through a third pad of the chip,
    wherein the comparison result is delayed by a delay time.

16. The over-voltage protection method of claim 15, wherein the delay time is long enough to detect a transition in the supply voltage.

17. The over-voltage protection method of claim 15, wherein the delay time is generated by a delay circuit enabled when a reference voltage is greater than a given voltage.

18. The over-voltage protection method of claim 17, wherein the delay circuit is disposed on the chip and is an RC-DELAY Power On Reset (POR) circuit.

19. The over-voltage protection method of claim 17, wherein the reference voltage is obtained by dividing the supply voltage at a given ratio using a plurality of resistors.

20. The over-voltage protection method of claim 15, wherein the supply voltage is applied to the chip when the first voltage is greater than the second voltage.

21. The over-voltage protection method of claim 15, wherein the first voltage saturates at a given voltage level.

22. The over-voltage protection method of claim 21, wherein the first voltage varies according to a plurality of bipolar junction transistor (BJT) diodes disposed on the chip, the number of which determines the given voltage level at which the first voltage saturates.

23. The over-voltage protection method of claim 15, wherein the second voltage is proportional to the supply voltage.

24. The over-voltage protection method of claim 23, wherein the second voltage varies depending on a resistor ladder disposed on the chip and including at least two resistors connected to each other in series.

25. The over-voltage protection method of claim 15, wherein the chip is a System On Chip (SOC).

* * * * *